US007134288B2

(12) United States Patent
Crippen et al.

(10) Patent No.: US 7,134,288 B2
(45) Date of Patent: Nov. 14, 2006

(54) SYSTEM, METHOD, AND APPARATUS FOR PROVIDING A THERMAL BYPASS IN ELECTRONIC EQUIPMENT

(75) Inventors: Martin Joseph Crippen, Apex, NC (US); Jason Aaron Matteson, Raleigh, NC (US); William Joseph Piazza, Holly Springs, NC (US)

(73) Assignee: International Business Machines Corporation, Armonk, NY (US)

( * ) Notice: Subject to any disclaimer, the term of this patent is extended or adjusted under 35 U.S.C. 154(b) by 409 days.

(21) Appl. No.: 10/842,284

(22) Filed: May 10, 2004

(65) Prior Publication Data

US 2005/0247067 A1 Nov. 10, 2005

(51) Int. Cl.
*F25B 21/02* (2006.01)
(52) U.S. Cl. ......................................... 62/3.2; 62/259.2
(58) Field of Classification Search ................ 62/3.3, 62/3.6, 3.7, 259.2; 361/687
See application file for complete search history.

(56) References Cited

U.S. PATENT DOCUMENTS

| 4,126,269 A | * | 11/1978 | Bruges ....................... 236/49.3 |
| 4,935,864 A | | 6/1990 | Schmidt et al. |
| 5,431,021 A | | 7/1995 | Gwilliam et al. |
| 6,198,628 B1 | | 3/2001 | Smith |
| 6,580,609 B1 | * | 6/2003 | Pautsch ....................... 361/698 |
| 6,639,794 B1 | * | 10/2003 | Olarig et al. ................ 361/687 |

* cited by examiner

Primary Examiner—Melvin Jones
(74) Attorney, Agent, or Firm—Martin J. McKinley; Dillon & Yudell LLP

(57) ABSTRACT

A system enclosure uses two heat exchangers and a thermoelectric cooling module to manage heat within the system. An airflow enters the system and is heated by server blades. Portions of the airflow split and travel to various portions of the system enclosure. Some heat is removed from the airflow by passing through the first heat exchanger before circulating around downstream subsystems. The first heat exchanger contacts the cold side of a TEC module, to reduce the temperature of that airflow. The air then enters the network switch module or other subsystem where it is further heated. Thereafter, the second heat exchanger 'bypasses' those components by reinserting the upstream heat back into the downstream airflow. The second heat exchanger contacts the hot side of the TEC module. The mixture of all heated air is then expelled from the system enclosure.

20 Claims, 4 Drawing Sheets

SYSTEM, METHOD, AND APPARATUS FOR PROVIDING A THERMAL BYPASS IN ELECTRONIC EQUIPMENT

BACKGROUND OF THE INVENTION

1. Technical Field

The present invention relates in general to an improved thermal management design and, in particular, to an improved system, method, and apparatus for thermally bypassing selected components in electronic equipment.

2. Description of the Related Art

It is well known in the industry that heat contributes to early failures of electronic equipment. As processor clock speeds and rotational speeds of magnetic media increase and the number of processors used in some systems (e.g., servers) increases, heat becomes even more of an issue. In some designs it is necessary to use air that has already passed over hot components to cool other components that are further "downstream" with respect to the airflow.

For example, in IBM's BladeCenter™, air enters a frontal enclosure, passes numerous server blades, then passes through network switch modules, management modules, and power modules before finally being drawn out of the system and expelled from the enclosure via blowers. Thus, the ambient air is heated (e.g., to as much as approximately 54° C.) by the upstream components located at the front of the enclosure before arriving at the subsystems in the rear of the enclosure.

FIG. 1 depicts an enclosure that is similar in many regards to the BladeCenter™ system enclosure 100. The system enclosure 100 comprises one or more server blades 110 (which, in turn, comprise one or more CPUs, memory, support and I/O chips, DASD, etc.), one or more network switch modules 130, and one or more air moving devices 150 (e.g., a fan or blower). Also within the enclosure 100 are a number of air plenums, such as a central plenum 120 and a plenum 140 at the entrance to the air-moving devices 150.

Air 160 enters the front of the system enclosure 100 and passes across the server blade components 110 where it is "pre-heated" 160a by those components 110. The heated air may diverge along different paths with some air 160b traveling to the top of the enclosure 100 and passing down through the network switch modules 130 or other components where it is further heated 160d. Some air 160c may traverse other routes to reach the final plenum. The mixture of all of the heated air is then expelled 160e from the system enclosure 100.

The use of "pre-heated" airflow in system enclosures results from two requirements. First, some applications mandate only front-to-rear airflow within the enclosure, since there are constraints on the use of the top, bottom, and sides of the enclosure for cooling purposes. Second, these configurations minimize server volume and the paths provided for airflow. Thus, the continued or reuse of air through "series cooling" of devices is essential.

In the prior art, a number of solutions have been proposed to address this issue. For example, in U.S. Pat. No. 4,935,864, a Peltier device is bonded to an integrated circuit chip. The cold side of the Peltier device cools the chip and the hot side is connected to heat sinks to dissipate heat. This design uses a single heat exchanger and requires a redesign of the subsystem to incorporate the Peltier device and heat sink.

U.S. Pat. No. 5,431,021, teaches that the operational efficiency of a thermoelectric cooling (TEC) device can be increased by injecting moisture into the gas flowing over the hot side heat exchanger. A TEC module is a solid state device that takes advantage of the Peltier effect whereby current flowing through a junction of dissimilar metals (or of a metal and a semiconductor) produces localized heating or cooling, depending upon the direction of the current flow. TECs are configured to use hundreds of such junctions. The junctions are configured to be electrically in series and thermally in parallel, with the net effect of producing cooling on one side of the TEC and heating on the opposing side of the TEC. The history and a tutorial on TECs can be found on the Internet at, for example, www.tellurex.com/cthermo.html.

TECs also find use in applications where the cold surface is placed on one side of a thermal barrier (e.g., inside a cooler), and the hot surface is placed outside the barrier. The cold surface decreases the temperature of the air that flows around it on one side of the barrier while the air circulating on the other side of the barrier carries off heat produced by the hot surface.

The U.S. Pat. No. 5,431,021 patent describes two heat exchangers with an interposing TEC. The flow over the two heat exchangers are described as separate, possibly even different types of fluids, although it is mentioned that they might both be air. This design seeks to increase the efficiency of a TEC used in a medical device, but makes no reference to bypassing heat around a subsystem of electrical equipment.

U.S. Pat. No. 6,198,628, teaches a method of providing localized cooling within an enclosure: a serial airflow is provided from some inlet vents, through a number of subsystems, through an air moving device, and out of the enclosure. In addition, one or more parallel air paths are provided to allow air to enter through alternate inlets and pass directly over subsystems where localized cooling is required before joining the serial airflow stream and passing thought he air moving device and out of the enclosure.

Another way hotter subsystems have been handled was to increase the flow of air through the enclosure. However, there are practical constraints on how fast and how much-air can be blown through an enclosure. In addition, increased airflow rates give rise to other problems such as increased noise and increased contamination (e.g., dust and lint) as large volumes of ambient air are drawn into the enclosure and "filtered" by the internal components.

As processors continue to increase in speed and power consumption, there is also a point of diminishing returns. Eventually, either the downstream components must acceptably cooled by hotter air, or the ability to support the same number of upstream components must be restricted to reduce pre-heating. It would be desirable to allow higher levels of pre-heating by some components without affecting the intake temperature of downstream components.

SUMMARY OF THE INVENTION

One embodiment of a system, method, and apparatus for lowering the temperature of electronic circuitry in situations where the circuitry is thermally "downstream" of other hot components is disclosed. The airflow reaching the downstream circuitry has passed through other upstream components and has been pre-heated, thereby reducing the cooling capacity of the airflow. The present invention works by removing heat from the incoming or ambient airflow and transferring the heat directly to the outlet airflow of the subsystem, thereby effectively bypassing the subsystem in a thermal sense.

The present invention teaches that a thermoelectric cooling (TEC) module may be combined with heat exchanger elements and positioned in such a way that the incoming air entering a subsystem may be cooled and the extracted heat may be transferred directly to the exhaust of that subsystem through the TEC. While not greatly affecting the final exhaust temperature of the enclosure, the invention allows localized cooling within a portion of the enclosure, from which the downstream subsystems may greatly benefit. The present application of TECs is also easily differentiated by noting that the invention involves a single airflow that is cooled at one point and heated at another point in such a way that some of the heat in the air effectively bypasses a portion of the flow path.

Because of the limited distance that can be provided between the end plates of a TEC, they are most commonly used in applications where the cold surface contacts a hot component (such as an integrated circuit) and the hot surface contacts a heat exchanger (such as a heat sink). The cold surface of the TEC is used to cool the integrated circuit and a stream of air over the heat sink circuit carries off the heat generated by the hot side of the TEC. This application can be differentiated from the present invention by noting that the present invention utilizes two heat exchangers instead of one the present invention does not require modification of the thermally protected subsystem (such as the placement of a TEC against the components), and the present invention involves the removal of heat from a given stream of air and the injection of heat into the same stream of air at a different location.

In one embodiment, the present invention comprises two heat exchangers and a thermoelectric cooling module. In operation, air enters the system enclosure through the front as described above and is heated by the server blades. Portions of the airflow split, with some traveling to the top of the system enclosure and other portions finding other paths to the final plenum. The invention as shown may incorporate a modification of the space previously occupied by the network switch. However, it should be noted that the same goal can be achieved by keeping the network switch unchanged and by controlling the flow of air around and into the network switch and heat exchangers.

The air circulating around the network switch(es) or other downstream subsystems has some heat removed by passing through the first heat exchanger. This heat exchanger is in contact with the cold side of the TEC module, thereby reducing the temperature of that airflow. The air then enters the network switch module or other subsystem where it is further heated. Thereafter, the second heat exchanger 'bypasses' those components by reinserting the upstream heat back into the downstream airflow. This second heat exchanger is in contact with the heating side of the TEC module. The mixture of all heated air is then expelled from the system enclosure.

The foregoing and other objects and advantages of the present invention will be apparent to those skilled in the art, in view of the following detailed description of the present invention, taken in conjunction with the appended claims and the accompanying drawings.

BRIEF DESCRIPTION OF THE DRAWINGS

So that the manner in which the features and advantages of the invention, as well as others which will become apparent are attained and can be understood in more detail, more particular description of the invention briefly summarized above may be had by reference to the embodiment thereof which is illustrated in the appended drawings, which drawings form a part of this specification. It is to be noted, however, that the drawings illustrate only an embodiment of the invention and therefore are not to be considered limiting of its scope as the invention may admit to other equally effective embodiments.

DETAILED DESCRIPTION OF THE INVENTION

Figure 2:
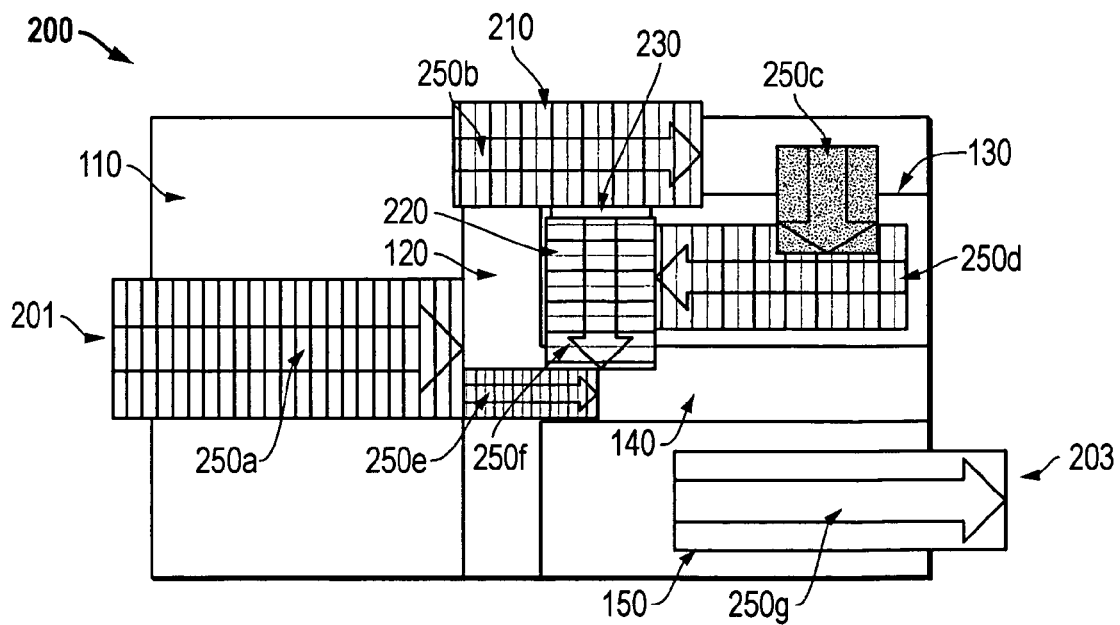
FIG. 2 is a schematic side view of one embodiment of thermal management system for a system enclosure and is constructed in accordance with the present invention.

Referring to FIG. 2, one embodiment of a system, method, and apparatus for thermal management in an electronics environment is shown and constructed in accordance with the present invention. In the embodiment illustrated, the present invention is configured with a first heat exchanger 210, a second heat exchanger 220, and a thermoelectric cooling (TEC) module 230. Air 250 enters the system enclosure 200 through an ingress or front entry 201 and is heated or "pre-heated" 250a by server blade(s) 110. The airflow may split into a portion 250b that travels to a section (e.g., the top) of the system enclosure 200, and a portion 250e that finds other paths to the final plenum.

In accordance with the present invention, air destined for the network switch 130 or other subsystem(s) has some heat removed 250b by passing by or through the first heat exchanger 210. The heat exchanger 210 is coupled to or in contact with the cold side of the TEC module 230. The air temperature of this air is thereby reduced. The air 250c then enters the network switch module 130 or other subsystem where it is further heated 250d before passing or entering the second heat exchanger 220, where the 'bypassed' heat is inserted back into the airflow 250f. This second heat exchanger 220 is coupled to or in contact with the heating side of the TEC module 230. Finally, the mixture of all of the heated air 250g is expelled from the system enclosure 200 at an egress or rear exit 203.

The present invention may be incorporated as original equipment in an electronics environment, or as a modification of an existing electronics environment. In addition, the present invention may be located in the space previously occupied by the network switch 130, or by keeping the network switch 130 unchanged and by controlling the flow of air around and into the network switch and heat exchangers.

In more generic terms, the present invention comprises a system for thermal management of an electronics environment. The enclosure 200 has an ingress (intake) 201, an egress (exhaust) 203, and an airflow path 250 (e.g., plenums 120, 140) extending through the enclosure 200 from the ingress 201 to the egress 203. In one version, the ingress 201 is the only ingress for the airflow path 250 and the egress 203 is the only egress for the airflow path 250. Thus, from start to finish there is only one pathway (i.e., no other vents) through the enclosure 200.

A first subsystem (e.g., server blade 110) is located between the ingress 201 and a second subsystem 130. The second subsystem (e.g., network switch 130) is located in the airflow path 250 between the first subsystem 110 and the egress 203. Heat transfer means (e.g., 210, 220, 230) are used for removing heat from an airflow in the airflow path 250b that is downstream of the first subsystem 110, and reintroducing said heat into said airflow downstream 250f of the second subsystem 130, such that said heat thermally bypasses the second subsystem 130. Thus, the airflow passes the first and second heat exchangers at different times along the airflow path, and heat is removed from the airflow at the first heat exchanger and added back to the airflow at the second heat exchanger, thereby temporarily taking some of the heat out of the airflow path.

Figure 5:
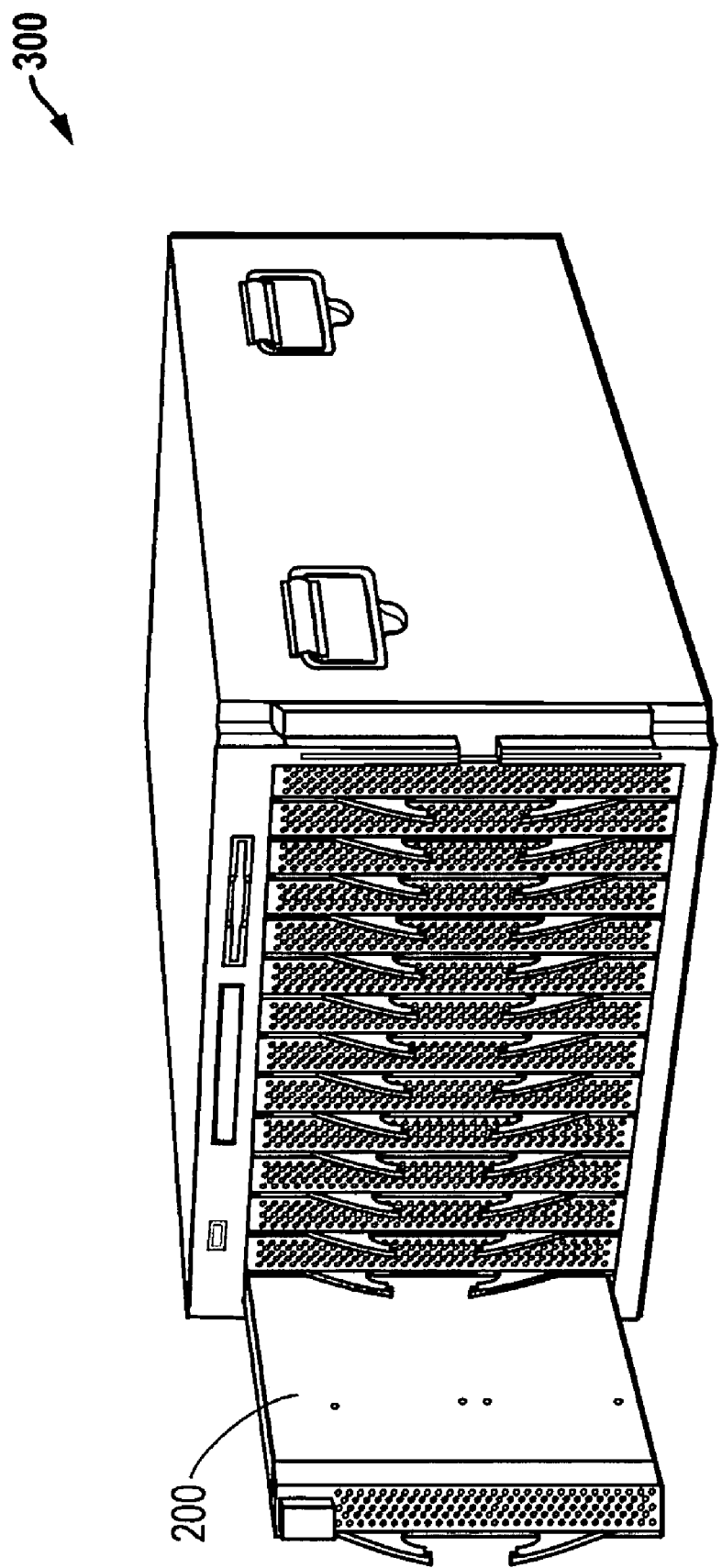
FIG. 5 is an isometric view of one embodiment of a system of enclosures and is constructed in accordance with the present invention.

The enclosure 200 may be provided with enclosed side walls, a top, and a bottom, as in the case of the BladeCenter™ 300 (FIG. 5). In one embodiment, the heat transfer means comprises two heat exchangers 210, 220 and means (e.g., a thermoelectric cooler 230 coupled to both the first and second heat exchangers 210, 220) for transferring heat therebetween. The heat transfer means may be located inside the enclosure 200 but outside the second subsystem 130 such that existing enclosures are capable of being retrofitted by the system. The air moving device 150 (e.g., a blower) may be located inside the enclosure for moving air through the airflow path 250 in the enclosure.

Figure 6:
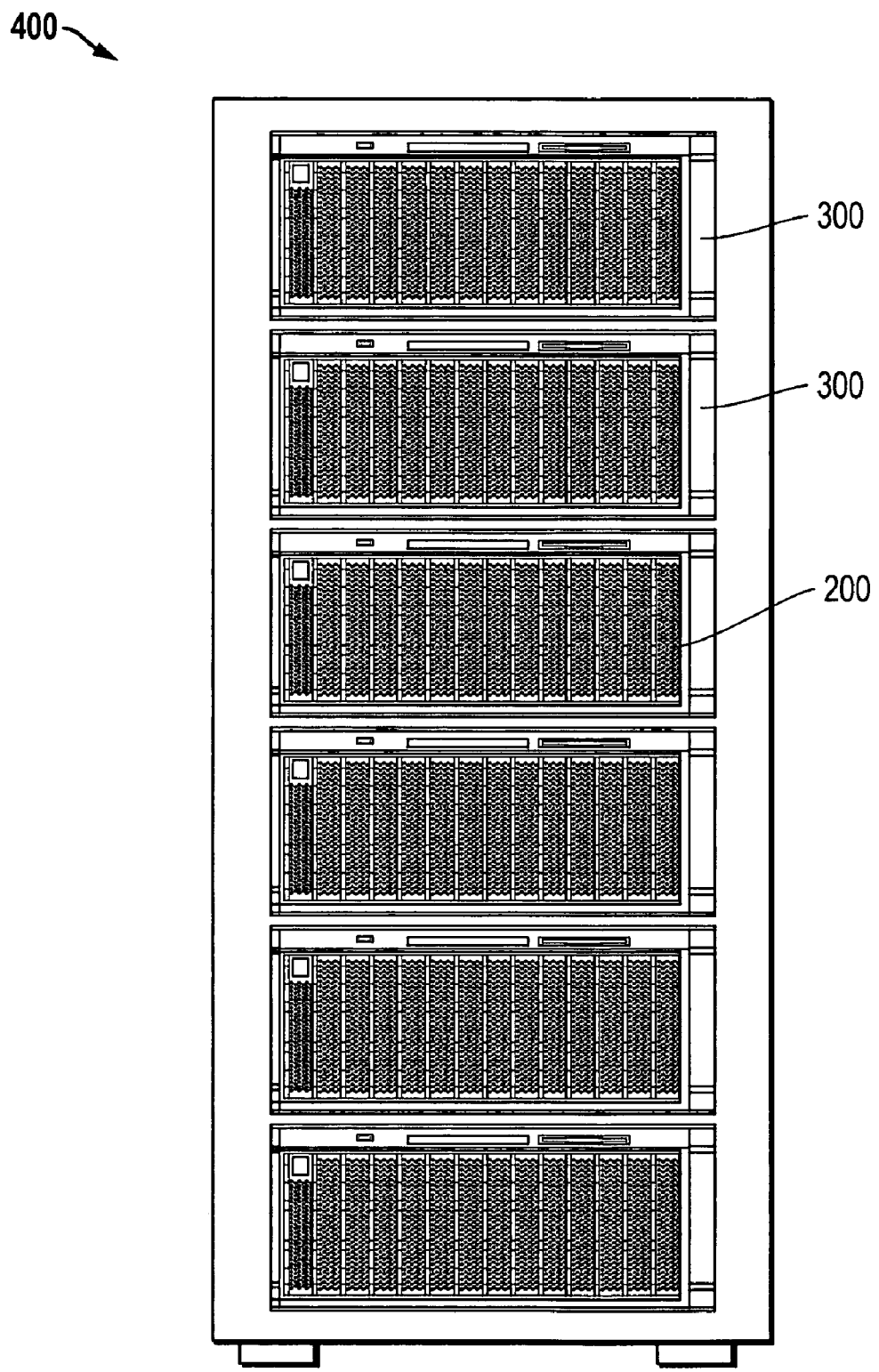
FIG. 6 is a front view of a rack of the system of enclosures of FIG. 5 and is constructed in accordance with the present invention.

As stated above the present invention also comprises a method of thermal management, such as with multiple enclosures 200 that are mounted in a rack 400 (FIG. 6). One embodiment of the method comprises flowing air through an electronics environment having first and second subsystems, heating the airflow with the first subsystem, removing heat from the airflow before the airflow reaches the second subsystem, cooling the second subsystem with the airflow after said heat has been removed in the previous step, reintroducing said heat back into the airflow after the airflow has passed the second subsystem, and then ejecting the airflow and said heat from the electronics environment.

Alternatively, the method may comprise entering the airflow into the electronics environment through a single ingress, and exiting the airflow from the electronics environment through a single egress. The previous steps also may comprise withdrawing said heat from the airflow with a first heat exchanger, and releasing said heat into the airflow with a second heat exchanger. The heat may be transferred from the first heat exchanger to the second heat exchanger, and/or transferred with a thermoelectric cooler that is coupled to both the first and second heat exchangers. These steps may comprise heating the airflow with a server blade, and cooling a network switch. The intermediate steps of the method also may take place in the electronics environment, but outside of the second subsystem. The method may alternatively comprise moving the airflow with an air moving device through a plurality of plenums that, along with the air moving device, are located in the electronics environment.

Figure 1:
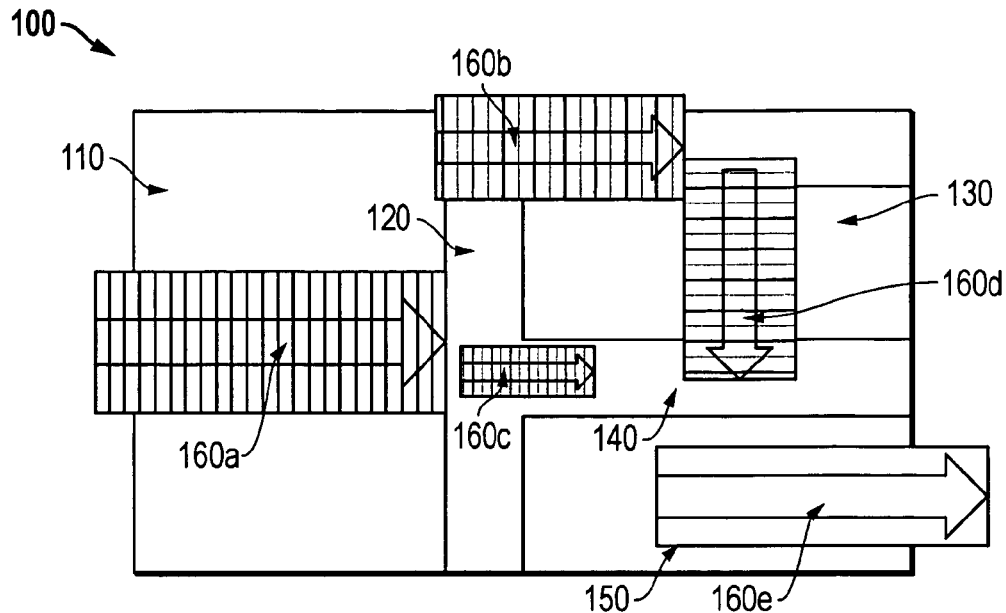
FIG. 1 is a schematic side view of a conventional system enclosure.
Figure 3:
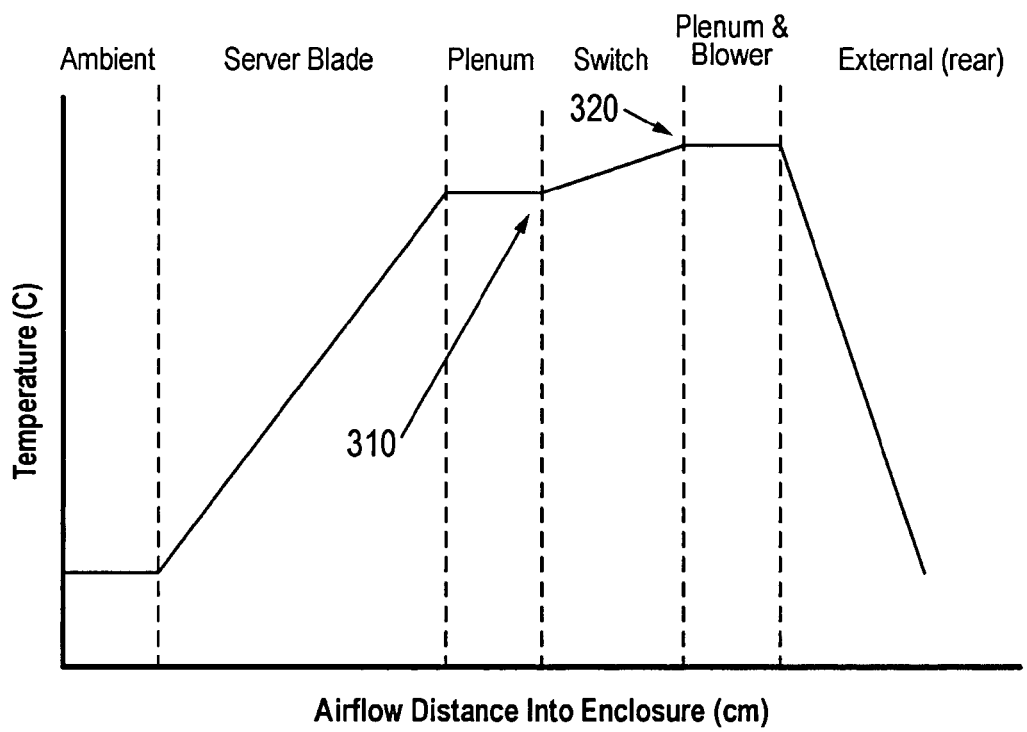
FIG. 3 is a plot of the temperature of airflow in the system enclosure of FIG. 1.

A comparison of the temperature profiles along a path of the air through the enclosure illustrates the benefit of the invention to the network switch module. In FIG. 3, it can be seen that, in the prior art enclosure of FIG. 1, air at the ambient room temperature enters the enclosure and is preheated by the server blade, passes through the plenum to the intake of the network switch and the temperature of the air 310 at the intake to the switch is quite high. The switch further increases the air temperature 320 and then the air passes through the final plenum and blower and leaves the enclosure where it mixes with room temperature air and cools off.

Figure 4:
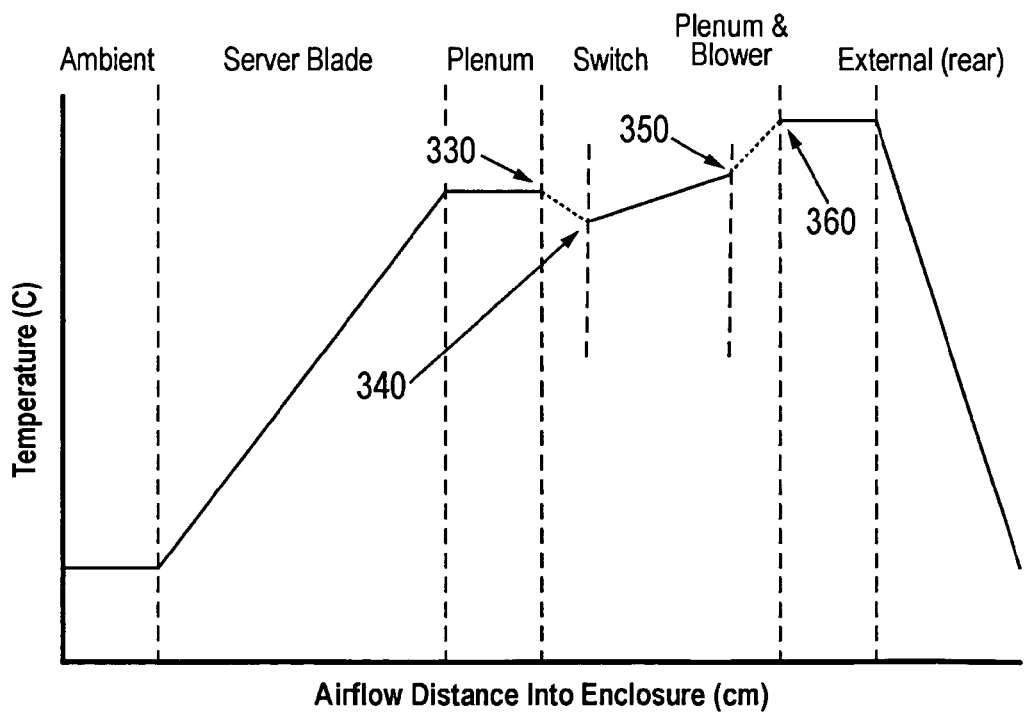
FIG. 4 is a plot of the temperature of airflow in the system enclosure of FIG. 2.

In FIG. 4, which depicts the performance of the embodiment of FIG. 2 of the present invention, room temperature air enters the enclosure and is pre-heated by the server blade. After passing through a plenum, the air 330 reaches the switch module. The air passes through the first heat exchanger, which lowers the air to temperature 340. The switch is then cooled by the lower temperature air, which it heats 350 to the same extent as before. Eventually, the air warmed by the switch reaches the second heat exchanger where the heat that was previously removed is reinserted 360.

The final air temperature leaving the switch may actually be higher than in the prior art case, because in addition to heat transferred into the air stream by the switch there is also additional heat contributed by the operation of the TEC. However, the air temperature provided to cool the switch itself is reduced and the additional heat contributed by the TEC may be downstream of all other components except for the blower, which tolerates higher operating temperatures than other components.

There are a number of factors that affect the usefulness of the present invention. Two primary considerations are the efficiency of the TEC module and the impedance to airflow presented by the two heat exchangers. The invention is particularly well suited for rack-mounted enclosures such as BladeCenter™ and similar products since these systems provide a shared thermal environment where, for example, switch modules and power supplies are cooled by air that has been pre-heated by processor blades. In addition, the BladeCenter™ promotes such a high spatial density of servers that power consumption and cooling become much more critical. The trend toward increasing processor clock speeds and multiprocessor designs results in ever-increasing temperatures for downstream components. Rack-mounted enclosures also impose limitations on the use of top bottom and side surfaces of the enclosure for cooling (e.g., venting).

Due to the low efficiency of the TEC modules, many additional watts of power maybe needed to operate the TEC and, in some circumstances, the additional power may not be available. The additional airflow impedance presented by the two heat exchangers described in this disclosure may necessitate adjustments to the apportionment of air within an enclosure. Thus, there are categories of equipment that would benefit from the present invention because they are less encumbered by power supply wattage and airflow impedance constraints. In addition, as technology improves and TECs and heat exchangers become more efficient, the present invention will become increasingly more efficacious.

Yet another advantage of the present invention is that the amount of heating and cooling can be controlled by regulating the current through the TEC and, therefore, the amount of thermal bypass can be controlled based upon the amount of preheating that is occurring. For example, if the server blades are lightly utilized and therefore producing little heat, the bypass can be shut off completely (to reduce energy consumption by the TEC). As the server blades begin producing heat, the bypass can be activated using first a small amount of current through the TEC and gradually increasing the current as needed. Moreover, the same current that flows to the heat generating load may be passed through the TEC, thereby producing more heat transfer at times when the load is producing more heat.

While the invention has been shown or described in only some of its forms, it should be apparent to those skilled in the art that it is not so limited, but is susceptible to various changes without departing from the scope of the invention.

What is claimed is:

1. A system for thermal management of an electronics environment, comprising:
   an enclosure having an ingress, an egress, and an airflow path extending through the enclosure from the ingress to the egress;
   a first subsystem located in the airflow path;
   a second subsystem located in the airflow path between the first subsystem and the egress; and
   heat transfer means for removing heat from an airflow in the airflow path that is downstream of the first subsystem and reintroducing said heat into said airflow downstream of the second subsystem, such that said heat thermally bypasses the second subsystem.

2. The system of claim 1, wherein the enclosure has enclosed side walls, a top, and a bottom, and the ingress is the only ingress for the airflow path and the egress is the only egress for the airflow path.

3. The system of claim 1, wherein the heat transfer means comprises two heat exchangers and means for transferring heat therebetween.

4. The system of claim 1, wherein the heat transfer means comprises:
   a first heat exchanger located between the first subsystem and the second subsystem;
   a second heat exchanger located downstream of the second subsystem; and
   a thermoelectric cooler coupled to both the first and second heat exchangers.

5. The system of claim 4, wherein the first subsystem comprises a server blade and the second subsystem comprises a network switch.

6. The system of claim 1, wherein the heat transfer means is located inside the enclosure but outside the second subsystem such that existing enclosures are capable of being retrofitted by the system.

7. The system of claim 1, further comprising an air moving device located inside the enclosure for moving air through the airflow path in the enclosure, and the airflow path comprises a plurality of plenums and the air moving device comprises a blower.

8. A system for thermal management of an electronics environment, comprising:
   an enclosure having an enclosed side walls, a top, and a bottom, the enclosure also having a front opening, a rear opening, and an airflow path extending from the front opening through the enclosure to the rear opening;
   a first subsystem located adjacent to the front opening;
   a second subsystem located between the first subsystem and the rear opening;
   a first heat exchanger located between the first subsystem and the second subsystem;
   a second heat exchanger located adjacent to the second subsystem;
   a thermoelectric cooler coupled to both the first and second heat exchangers; and
   an airflow is heated by the first subsystem, cooled by the first heat exchanger, heated by the second subsystem, and heated by the second heat exchanger from heat reintroduced from the first subsystem via the thermoelectric cooler, such that heat taken from the airflow by the first heat exchanger thermally bypasses the second subsystem and an air intake temperature of the second subsystem is reduced by the first heat exchanger.

9. The system of claim 8, wherein the front opening is the only ingress for the airflow path and the rear opening is the only egress for the airflow path.

10. The system of claim 8, wherein the first subsystem comprises a server blade and the second subsystem comprises a network switch.

11. The system of claim 8, wherein the thermoelectric cooler and the first and second heat exchangers are located inside the enclosure but outside the second subsystem such that existing enclosures are capable of being retrofitted by the system.

12. The system of claim 8, further comprising an air moving device located inside the enclosure for moving air through the airflow path in the enclosure, and the airflow path comprises a plurality of plenums and the air moving device comprises a blower.

13. The system of claim 8, wherein the airflow passes the first and second heat exchangers at different times along the airflow path, and heat is removed from the airflow at the first heat exchanger and added back to the airflow at the second heat exchanger, thereby temporarily taking some of the heat out of the airflow path.

14. A method of thermal management, comprising:
   (a) flowing air through an electronics environment having first and second subsystems;
   (b) heating the airflow with the first subsystem;
   (c) removing heat from the airflow before the airflow reaches the second subsystem;
   (d) cooling the second subsystem with the airflow after said heat has been removed in step (c);
   (e) reintroducing said heat back into the airflow after the airflow has passed the second subsystem; and then
   (f) ejecting the airflow and said heat from the electronics environment.

15. The method of claim 14, wherein step (a) comprises entering the airflow into the electronics environment through a single ingress, and step (f) comprises exiting the airflow from the electronics environment through a single egress.

16. The method of claim 14, wherein step (c) comprises withdrawing said heat from the airflow with a first heat exchanger, and step (e) comprises releasing said heat into the airflow with a second heat exchanger.

17. The method of claim 16, further comprising transferring said heat from the first heat exchanger to the second heat exchanger.

18. The method of claim 17, wherein said transferring step comprises transferring said heat with a thermoelectric cooler that is coupled to both the first and second heat exchangers.

19. The method of claim 14, wherein step (b) comprises heating the airflow with a server blade, and step (d) comprises cooling a network switch.

20. The method of claim 14, wherein steps (b), (c), and (d) take place in the electronics environment, but outside of the second subsystem, and moving the airflow with an air moving device through a plurality of plenums that, along with the air moving device, are located in the electronics environment.

* * * * *